(12) United States Patent
Jeon

(10) Patent No.: US 7,460,039 B2
(45) Date of Patent: Dec. 2, 2008

(54) SERIALIZER AND METHOD OF CONVERTING PARALLEL DATA INTO SERIAL DATA

(75) Inventor: Young-Jin Jeon, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/677,021

(22) Filed: Feb. 20, 2007

(65) Prior Publication Data

US 2007/0194956 A1 Aug. 23, 2007

(30) Foreign Application Priority Data

Feb. 20, 2006 (KR) .................. 10-2006-0015977

(51) Int. Cl.
*H03M 9/00* (2006.01)

(52) U.S. Cl. .................. 341/100; 341/101

(58) Field of Classification Search .......... 341/100, 341/101; 326/86; 327/108, 374; 365/189.05, 365/189.08

See application file for complete search history.

(56) References Cited

U.S. PATENT DOCUMENTS

| | | | |
|---|---|---|---|
| 5,512,854 A * | 4/1996 | Park | 327/374 |
| 6,107,946 A | 8/2000 | Jeong | |
| 6,127,849 A * | 10/2000 | Walker | 326/86 |
| 6,188,339 B1 | 2/2001 | Hasegawa | |
| 7,242,624 B2 * | 7/2007 | Kolla et al. | 365/189.08 |
| 7,280,411 B2 * | 10/2007 | Iwasaki | 365/189.05 |
| 2002/0149403 A1 * | 10/2002 | Chung et al. | 327/108 |
| 2003/0076821 A1 | 4/2003 | Takauchi et al. | |
| 2004/0100947 A1 | 5/2004 | Masaki | |

FOREIGN PATENT DOCUMENTS

KR 2002-0088517 11/2002
KR 10-0389985 6/2003

OTHER PUBLICATIONS

English language abstract of Korean Publication No. 10-0389985.

* cited by examiner

*Primary Examiner*—Peguy JeanPierre
(74) *Attorney, Agent, or Firm*—Marger Johnson & McCollom, P.C.

(57) ABSTRACT

A serializer including a pull-up unit configured to pull up an output node, and a plurality of data select units configured to receive a plurality of input data signals. Each data select unit includes a pull-up device configured to pull up the output node in response to a corresponding input data signal, and a pull-down device configured to pull down the output node in response to the corresponding input data signal.

19 Claims, 3 Drawing Sheets

SERIALIZER AND METHOD OF CONVERTING PARALLEL DATA INTO SERIAL DATA

CROSS-REFERENCE TO RELATED APPLICATIONS

This application claims priority under 35 USC § 119 to Korean Patent Application No. 2006-15977, filed on Feb. 20, 2006 in the Korean Intellectual Property Office (KIPO), the disclosure of which is incorporated herein in its entirety by reference.

BACKGROUND

1. Technical Field

This disclosure relates to a semiconductor memory device, and more particularly to a serializer and a method of converting parallel data with a low frequency into serial data with a high frequency.

2. Description of the Related Art

Generally, a high-speed transfer mode converting low-speed parallel data into high-speed serial data is used in network systems in order to transfer data at high speeds.

In a memory system, a parallel bus structure that has a wide bandwidth is typically used as a bus structure between a processor and a semiconductor memory in order to transfer a large amount of data. Since an operating speed of a semiconductor memory is lower than that of a processor, a processing speed of the entire memory system is also low.

A bus system having a wider bandwidth is needed in order to increase a processing speed between a processor and a semiconductor memory while maintaining an operating speed of the semiconductor memory. As a bandwidth becomes wider, the number of input/output (I/O) pins of a semiconductor memory device is also increased, sometimes by as much as hundreds of pins. Thus, a cost of a semiconductor memory device may be increased. High numbers of I/O pins are needed for high speed, high capacity and high performance, and thus manufacturing costs may be increased.

Therefore, in the field of semiconductor memory, active research on data serializing technologies that convert parallel data into serial data is being conducted in order to increase data transfer speeds between a memory and a processor.

A data serializing device in a semiconductor memory device is manufactured by complementary metal-oxide semiconductor (CMOS) circuit design technologies.

In a semiconductor memory device, a CMOS circuit technology is used in converting eight bits of parallel data having a differential form into ten bits of serial data. Ten branch circuits that respectively include one p-type MOS (PMOS) transistor as a pull-up device and one n-type MOS (NMOS) transistor as a pull-down device are coupled to an output node. When input data corresponds to a logic high, a voltage of the output node becomes a logic low rapidly through the branch circuits including NMOS transistors. However, when input data corresponds to a logic low, a voltage of the output node becomes a logic high relatively slowly because large parasitic capacitances generated from the ten branch circuits are charged by one small PMOS transistor. Imbalance between a rising transition time and a falling transition time at the output node causes a skew so that a data transfer speed may be decreased.

For a semiconductor memory device, a method for diminishing parasitic capacitances includes reducing the number of pull-down devices connected to an output node by half to raise a pull-up speed.

For a semiconductor memory device, another method of balancing between pull-up characteristics and pull-down characteristics at an output node equalizes the number of pull-up devices and pull-down devices.

FIG. 1 is a circuit diagram illustrating a conventional serializer.

Referring to FIG. 1, the serializer includes PMOS transistor MP1 between a supply voltage VDD and an output node N0. A gate of the PMOS transistor MP1 is provided with a bias voltage Vb. A voltage of the output node N0 is pulled up by the bias voltage Vb through the PMOS transistor MP1 with a predetermined current driving capability.

Four pull-down circuits PDC1, PDC2, PDC3 and PDC4 are coupled in parallel between the output node N0 and a ground voltage VSS. A first pull-down circuit PDC1 includes serially coupled NMOS transistors MN1, MN2 and MN3. A first clock signal CLK1 is applied to a gate of the NMOS transistor MN1, a second clock signal CLK2 is applied to a gate of the NMOS transistor MN2, and first input data IN1 is applied to a gate of the NMOS transistor MN3. A second pull-down circuit PDC2 includes serially coupled NMOS transistors MN4, MN5 and MN6. The second clock signal CLK2 is applied to a gate of the NMOS transistor MN4, a third clock signal CLK3 is applied to a gate of the NMOS transistor MN5, and second input data IN2 is applied to a gate of the NMOS transistor MN6. A third pull-down circuit PDC3 includes serially coupled NMOS transistors MN7, MN8 and MN9. The third clock signal CLK3 is applied to a gate of the NMOS transistor MN7, a fourth clock signal CLK4 is applied to a gate of the NMOS transistor MN8, and third input data IN3 is applied to a gate of the NMOS transistor MN9. A fourth pull-down circuit PDC4 includes serially coupled NMOS transistors MN10, MN11 and MN12. The fourth clock signal CLK4 is applied to a gate of the NMOS transistor MN10, the first clock signal CLK1 is applied to a gate of the NMOS transistor MN11, and fourth input data IN4 is applied to a gate of the NMOS transistor MN12. The NMOS transistors MN1 through MN12 are manufactured to have a higher current driving capability with respect to the PMOS transistor MP1.

FIG. 2 is a timing diagram illustrating operations of the serializer in FIG. 1.

Referring to FIG. 2, each of the four clock signals CLK1, CLK2, CLK3 and CLK4 have identical periods and are 90 degrees out of phase with each other. A phase of the second clock signal CLK2 is delayed as much as 90 degrees with respect to that of the first clock signal CLK1, a phase of the third clock signal CLK3 is delayed as much as 90 degrees with respect to that of the second clock signal CLK2, and a phase of the fourth clock signal CLK4 is delayed as much as 90 degrees with respect to that of the third clock signal CLK3. The first input data IN1 is synchronized with a rising edge of the first clock signal CLK1, the second input data IN2 is synchronized with a rising edge of the second clock signal CLK2, the third input data IN3 is synchronized with a rising edge of the third clock signal CLK3, and the fourth input data IN4 is synchronized with a rising edge of the fourth clock signal CLK4.

The first input data IN1 is transferred to the output node N0 while the first and second clock signals CLK1 and CLK2 are turned on, the second input data IN2 is transferred to the output node N0 while the second and third clock signals CLK2 and CLK3 are turned on, the third input data IN3 is transferred to the output node N0 while the third and fourth clock signals CLK3 and CLK4 are turned on, and the fourth input data IN4 is transferred to the output node N0 while the fourth and first clock signals CLK4 and CLK1 are turned on.

Thus, when input data is a logic high, although the PMOS transistor MP1 is turned on, one of the pull-down circuits PDC1, PDC2, PDC3 and PDC4 including the NMOS transistors, which have higher current driving capability with respect to the PMOS transistor MP1, is turned on so that the voltage of the output node N0 is pulled down to the ground voltage VSS in synchronization with the clock signal.

However, when input data is a logic low, although one of the pull-down circuits PDC1, PDC2, PDC3 and PDC4 is selected by the clock signal, the pull-down circuits PDC1, PDC2, PDC3 and PDC4 are turned off so that the voltage of the output node N0 is pulled up only by the PMOS transistor MP1 that is turned on.

As a result, a rising transition time may be longer than a falling transition time at the output node N0. In addition, a falling edge is synchronized with the clock signal, but a rising edge is not synchronized with the clock signal. Imbalance between a rising transition time and a falling transition time of serialized data may cause data skew.

SUMMARY

An embodiment includes a serializer including a pull-up unit configured to pull up an output node, and a plurality of data select units configured to receive a plurality of input data signals. Each data select unit includes a pull-up device configured to pull up the output node in response to a corresponding input data signal, and a pull-down device configured to pull down the output node in response to the corresponding input data signal.

An embodiment includes a method of converting parallel data into serial data including for each bit of the parallel data: enabling a pull-up driver to pull up a first node for each such bit in response to a first state of the bit, and enabling a pull-down driver to pull down the first node in response to a second state of the bit. The method also includes sequentially coupling each first node for each bit to an output node in response to a plurality of clock signals.

DETAILED DESCRIPTION

Figure 1:
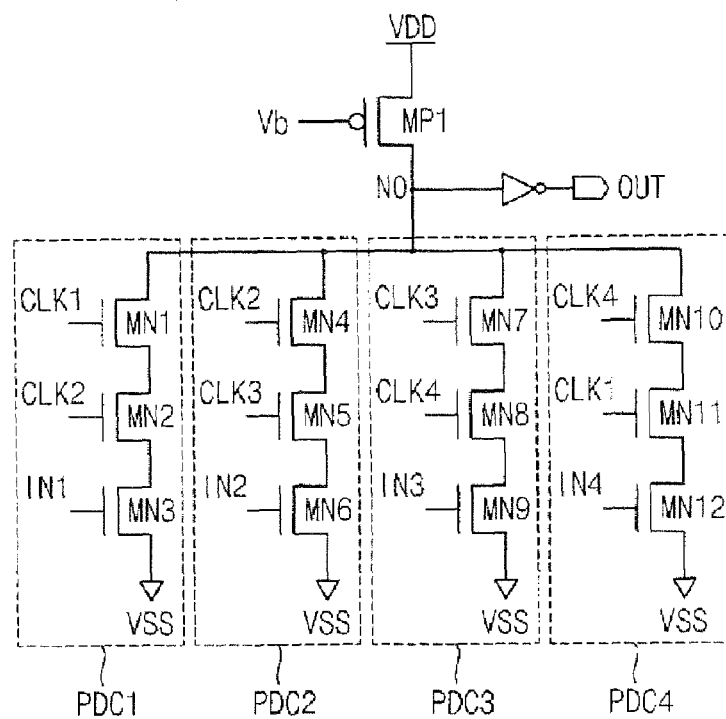
FIG. 1 is a circuit diagram illustrating a conventional serializer.
Figure 2:
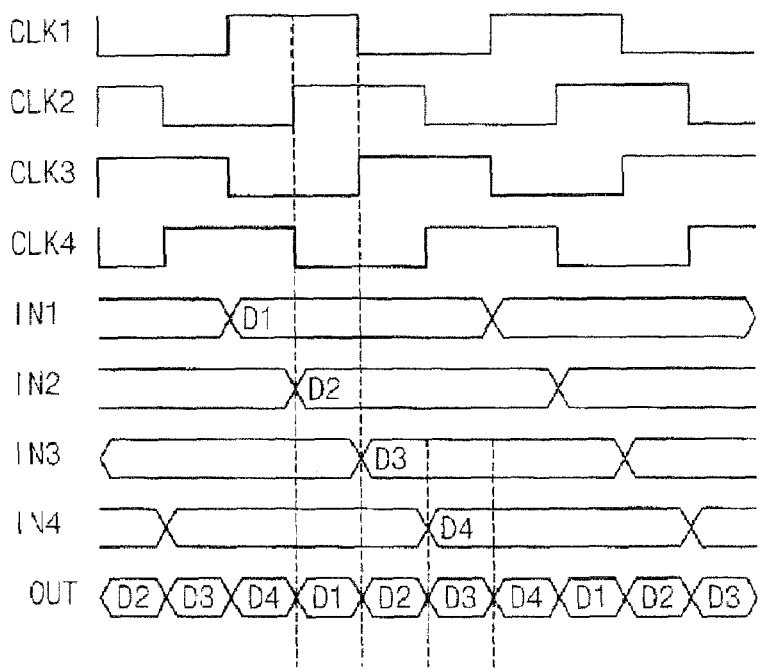
FIG. 2 is a timing diagram illustrating operations of the serializer in FIG. 1.

Embodiments will be described more fully with reference to the accompanying drawings. Embodiments may, however, take many different forms and should not be construed as limited to the embodiments set forth herein. Rather, these embodiments are provided so that this disclosure will be thorough and complete, and will fully convey the scope of the following claims to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
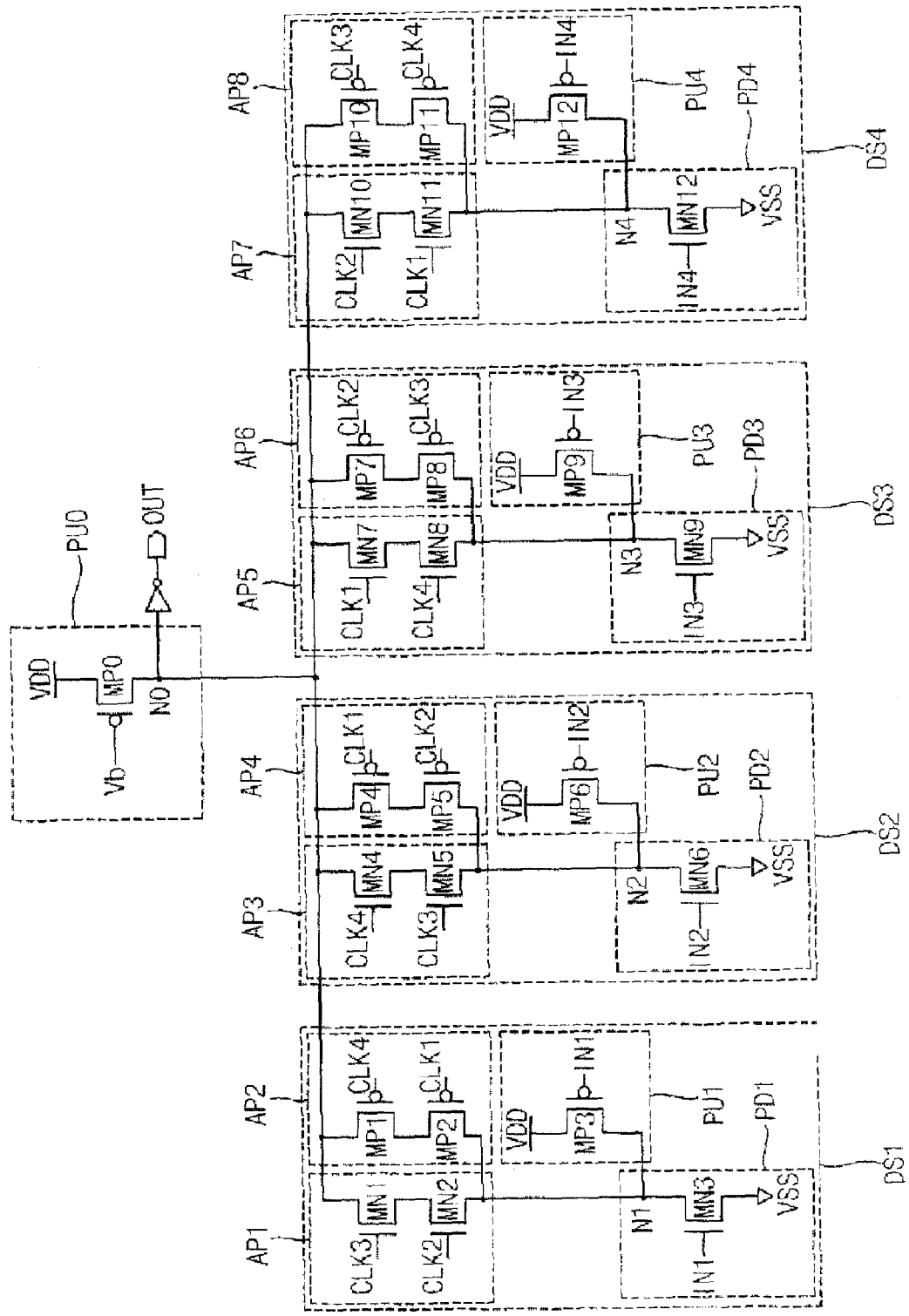
FIG. 3 is a circuit diagram illustrating an example of a serializer according to an embodiment.

FIG. 3 is a circuit diagram illustrating an example of a serializer according to an embodiment. The serializer includes a pull-up unit PU0, and data select units DS1, DS2, DS3 and DS4. The pull-up unit PU0 includes PMOS transistor MP0 coupled between a first supply voltage VDD and an output node N0. A voltage of the output node N0 can be pulled up to the first supply voltage VDD by the PMOS transistor MP0 with a first current driving capability.

The data select units DS1, DS2, DS3 and DS4 are commonly coupled to the output node N0. Input data IN1, IN2, IN3 and IN4 are sequentially selected by clock signals CLK1, CLK2, CLK3 and CLK4.

When input data corresponds to a first state, the voltage of the output node N0 may be pulled down to a second supply voltage VSS (for example, a ground voltage) by the data select units DS1, DS2, DS3 and DS4 with a higher current capability with respect to the first current driving capability. When input data corresponds to a second state, the voltage of the output node N0 may be pulled up to the first supply voltage VDD by the pull-up unit PU0. The second state corresponds to a logic low and the first state corresponds to a logic high.

A first data select unit DS1 includes a first active path AP1, a second active path AP2, a first pull-down device PD1, and a first pull-up device PU1. The first active path AP1 includes NMOS transistors MN1 and MN2 that are coupled in series between the output node N0 and a first node N1. A third clock signal CLK3 is applied to the NMOS transistor MN1 and a second clock signal CLK2 is applied to the NMOS transistor MN2. The second active path AP2 includes PMOS transistors MP1 and MP2 that are coupled in series between the output node N0 and the first node N1. A fourth clock signal CLK4 is applied to the PMOS transistor MP1 and a first clock signal CLK1 is applied to the PMOS transistor MP2. The first pull-up device PU1 includes PMOS transistor MP3 receiving first input data IN1. The first pull-down device PD1 includes NMOS transistor MN3 receiving the first input data IN1.

A second data select unit DS2 includes a third active path AP3, a fourth active path AP4, a second pull-down device PD2, and a second pull-up device PU2. The third active path AP3 includes NMOS transistors MN4 and MN5 that are coupled in series between the output node N0 and a second node N2. The fourth clock signal CLK4 is applied to the NMOS transistor MN4 and the third clock signal CLK3 is applied to the NMOS transistor MN5. The fourth active path AP4 includes PMOS transistors MP4 and MP5 that are coupled in series between the output node N0 and the second node N2. The first clock signal CLK1 is applied to the PMOS transistor MP4 and the second clock signal CLK2 is applied to the PMOS transistor MP5. The second pull-up device PU2 includes PMOS transistor MP6 receiving second input data IN2. The second pull-down device PD2 includes NMOS transistor MN6 receiving the second input data IN2.

A third data select unit DS3 includes a fifth active path AP5, a sixth active path AP6, a third pull-down device PD3, and a third pull-up device PU3. The fifth active path AP5 includes NMOS transistors MN7 and MN8 that are coupled in series between the output node N0 and a third node N3. The first clock signal CLK1 is applied to the NMOS transistor MN7 and the fourth clock signal CLK4 is applied to the NMOS transistor MN8. The sixth active path AP6 includes PMOS transistors MP7 and MP8 that are coupled in series between the output node N0 and a third node N3. The second clock signal CLK2 is applied to the PMOS transistor MP7 and the third clock signal CLK3 is applied to the PMOS transistor MP8. The third pull-up device PU3 includes PMOS transistor MP9 receiving a third input data IN3. The third pull-down device PD3 includes NMOS transistor MN9 receiving the third input data IN3.

A fourth data select unit DS4 includes a seventh active path AP7, an eighth active path AP8, a fourth pull-down device PD4, and a fourth pull-up device PU4. The seventh active path AP7 includes NMOS transistors MN10 and MN11 that are coupled in series between the output node N0 and a fourth node N4. The second clock signal CLK2 is applied to the NMOS transistor MN10 and the first clock signal CLK1 is applied to the NMOS transistor MN11. The eighth active path AP8 includes PMOS transistors MP10 and MP11 that are coupled in series between the output node N0 and the fourth node N4. The third clock signal CLK3 is applied to the PMOS transistor MP10 and the fourth clock signal CLK4 is applied to the PMOS transistor MP11. The fourth pull-up device PU4 includes PMOS transistor MP12 receiving a fourth input data IN4. The fourth pull-down device PD4 includes NMOS transistor MN12 receiving the fourth input data IN4.

Figure 4:
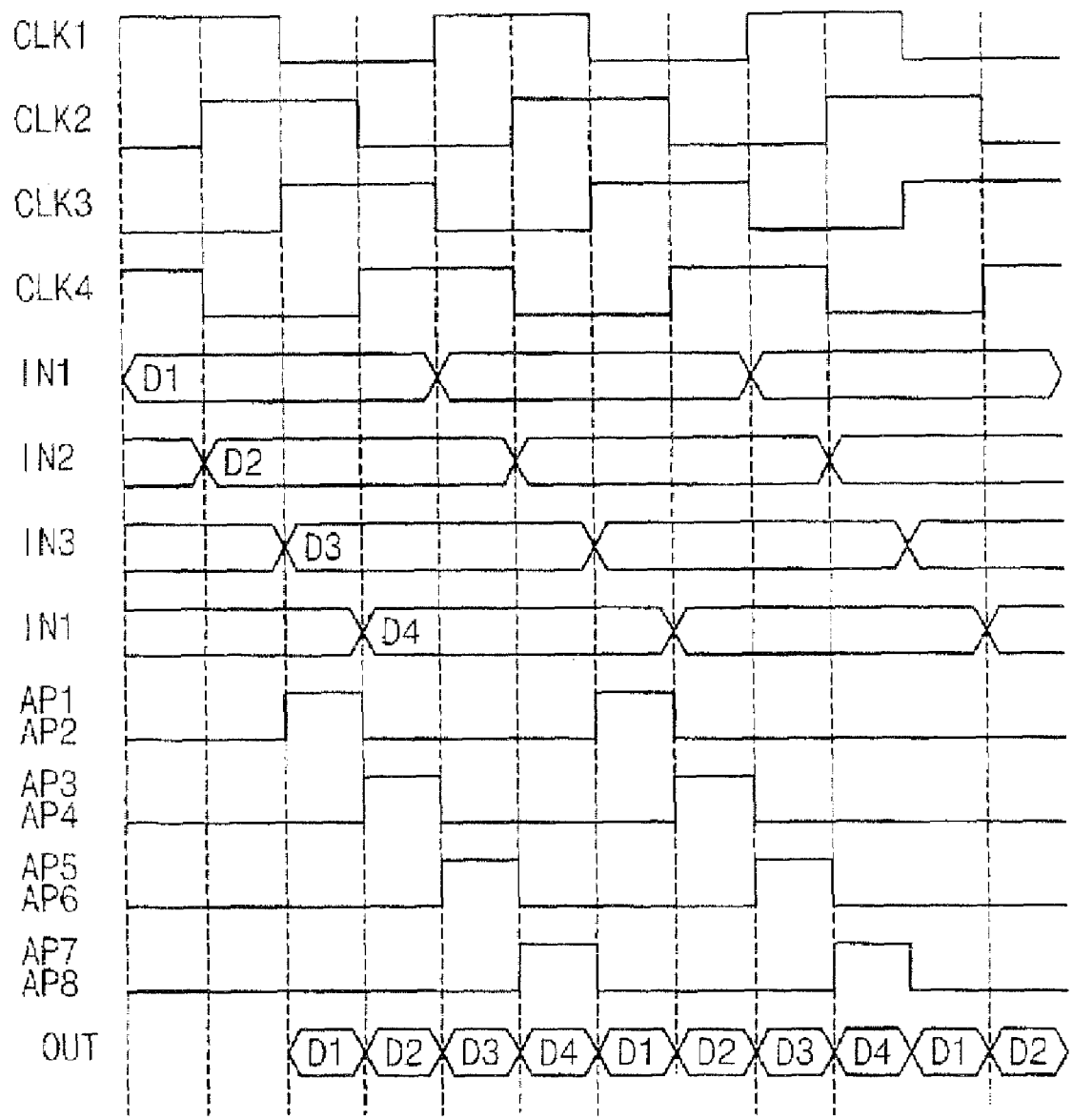
FIG. 4 is a timing diagram illustrating operations of the serializer in FIG. 3.

FIG. 4 is a timing diagram illustrating operations of the serializer in FIG. 3. The first active path AP1 is turned on while the second and third clocks CLK2 and CLK3 are logic high and the second active path AP2 is turned on while the fourth and first clocks CLK4 and CLK1 are logic low so that a voltage of the first node N1 is transferred to the output node N0. When the first input data IN1 is a logic high, the voltage of the output node N0 may be pulled down to the second supply voltage VSS by NMOS transistor MN3 through the first active path AP1. When the first input data IN1 is a logic low, the voltage of the output node N0 may be rapidly pulled up to the first supply voltage VDD by both PMOS transistor MP0 and PMOS transistor MP3. Thus, first data D1 may be output at an output terminal OUT.

The third active path AP3 is turned on while the fourth and third clocks CLK4 and CLK3 are logic high and the fourth active path AP4 is turned on while the first and second clocks CLK1 and CLK2 are logic low so that a voltage of the second node N2 is transferred to the output node N0. When the second input data IN2 is a logic high, the voltage of the output node N0 may be pulled down to the second supply voltage VSS by NMOS transistor MN6 through the third active path AP3. When the second input data IN2 is a logic low, the voltage of the output node N0 may be rapidly pulled up to the first supply voltage VDD by both PMOS transistor MP0 and PMOS transistor MP6. Thus, second data D2 may be output at the output terminal OUT.

The fifth active path AP5 is turned on while the first and fourth clocks CLK1 and CLK4 are logic high and the sixth active path AP6 is turned on while the second and third clocks CLK2 and CLK3 are logic low so that a voltage of the third node N3 is transferred to the output node N0. When the third input data IN3 is a logic high, the voltage of the output node N0 may be pulled down to the second supply voltage VSS by NMOS transistor MN9 through the fifth active path AP5. When the third input data IN3 is a logic low, the voltage of the output node N0 may be rapidly pulled up to the first supply voltage VDD by both PMOS transistor MP0 and PMOS transistor MP9. Thus, third data D3 may be output at the output terminal OUT.

The seventh active path AP7 is turned on while the second and first clocks CLK2 and CLK1 are logic high and the eighth active path AP8 is turned on while the third and fourth clocks CLK3 and CLK4 are logic low so that a voltage of the fourth node N4 is transferred to the output node N0. When the fourth input data IN4 is a logic high, the voltage of the output node N0 may be pulled down to the second supply voltage VSS by NMOS transistor MN12 through the seventh active path AP7. When the fourth input data IN4 is a logic low, the voltage of the output node N0 may be rapidly pulled up to the first supply voltage VDD by both PMOS transistor MP0 and PMOS transistor MP12. Thus, fourth data D4 may be output at the output terminal OUT. Thus, for each input data IN1-IN4, a respective PMOS transistor, MP3, MP6, MP9, and MP12, and the PMOS transistor MP0 pull up the output node N0.

In the described embodiments of the present invention, the voltage of the output node N0 may be pulled up rapidly through two active paths so that a rising transition time of an output signal may be decreased in synchronization with a clock signal. Similarly, the voltage of the output node N0 may be pulled down through two active paths so that a falling transition time may be also decreased. Accordingly effects of parasitic capacitances coupled to the output node N0 are reduced.

Although only four data select units have been described above, any number of data select units can be similarly coupled.

As mentioned above, the serializer and the method of converting parallel data into serial data according to example embodiments of the present invention may reduce data skew and increase operating speed by pulling a voltage of an output node up rapidly in synchronization with a clock signal.

While embodiments and their advantages have been described in detail, it should be understood that various changes, substitutions and alterations may be made herein without departing from the scope of the following claims.

What is claimed is:

1. A serializer comprising:
   a pull-up unit coupled between a first supply voltage and an output node and configured to pull a voltage of the output node up to the first supply voltage with a first current driving capability; and
   a plurality of data select units commonly coupled to the output node and configured to sequentially provide a plurality of input data to the output node in response to a plurality of clock signals, each of the data select units including:
  a pull-down device configured to pull down the voltage of the output node to a second supply voltage with a second current driving capability when a corresponding input data corresponds to a first state; and
  a pull-up device configured to pull up the voltage of the output node to the first supply voltage with the pull-up unit when the corresponding input data corresponds to a second state;
wherein the second current driving capability is greater than the first current driving capability.

2. The serializer of claim 1, wherein each of the data select units further comprises:
  a first active path coupled between the output node and a first node and configured to be activated in response to a first clock signal group selected from the clock signals; and
  a second active path coupled between the output node and the first node and configured to be activated in response to a second clock signal group selected from the clock signals;
  wherein:
    the pull-down device is coupled between the first node and the second supply voltage and configured to pull the voltage of the output node down to the second supply voltage through at least one of the first and second active paths; and
    the pull-up device is coupled between the first node and the first supply voltage and configured to pull the voltage of the output node up to the first supply voltage through at least one of the first and second active paths.

3. The serializer of claim 2, wherein current driving capabilities of the pull-down device and the pull-up device are higher than the first current driving capability.

4. The serializer of claim 2, wherein the first active path comprises a plurality of serially coupled n-type metal-oxide semiconductor (NMOS) transistors, the NMOS transistors being turned on in response to the first clock signal group.

5. The serializer of claim 2, wherein the second active path comprises a plurality of serially coupled p-type MOS (PMOS) transistors, the PMOS transistors being turned on in response to the second clock signal group.

6. The serializer of claim 2, wherein for each data select unit, phases of the first clock signal group are opposite to phases of the second clock signal group.

7. The serializer of claim 1, wherein the first state of the input data corresponds to a logic high state and the second state of the input data corresponds to a logic low state.

8. A serializer comprising:
  a pull-up unit configured to pull up an output node; and
  a plurality of data select units configured to receive a plurality of input data signals, each data select unit including:
    a pull-up device configured to pull up the output node in response to a corresponding input data signal; and
    a pull-down device configured to pull down the output node in response to the corresponding input data signal.

9. The serializer of claim 8, wherein for each data select unit:
  the pull up device is configured to pull up the output node only in response to a first state of the corresponding input data signal; and
  the pull-down device is configured to pull down the output node only in response to a second state of the corresponding input data signal.

10. The serializer of claim 8, each data select unit further comprising:
  a plurality of active paths, each active path coupled between a first node of the data select unit and the output node, and each active path responsive to a corresponding group of clock signals.

11. The serializer of claim 10, wherein for each data select unit, when one of the active paths is conductive, the other active paths are conductive.

12. The serializer of claim 10, wherein, for any state of the groups of the clock signals, only the active paths of a signal data select unit are conductive.

13. The serializer of claim 10, wherein for each data select unit, the pull up device is configured to pull up the output node through at least one of the active paths.

14. The serializer of claim 10, wherein for each data select unit, the groups of the clock signals of the active paths include every clock signal from every group.

15. A method of converting parallel data into serial data comprising:
  for each bit of the parallel data:
    enabling a pull-up driver to pull up a first node for each such bit in response to a first state of the bit; and
    enabling a pull-down driver to pull down the first node in response to a second state of the bit; and
  sequentially coupling each first node for each bit to an output node in response to a plurality of clock signals.

16. The method of claim 15, further comprising:
  pulling up the output node.

17. The method of claim 15, wherein sequentially coupling each first node for each bit to the output node further comprises for each first node:
  coupling the first node to the output node in response to all of the clock signals.

18. The method of claim 15, wherein for each first node, the clock signals that couple the first node to the output node are divided into a first groups of clock signals and a second group of clock signals, the first group of clock signals having opposite phases as the second group of clock signals.

19. The method of claim 15, further comprising:
  for each bit of the parallel data:
    disabling the pull-up driver in response to the second state of the bit; and
    disabling the pull-down driver in response to the first state of the bit.

* * * * *